(12) United States Patent
Fan et al.

(10) Patent No.: US 10,832,943 B2
(45) Date of Patent: Nov. 10, 2020

(54) GATE CONTACT OVER ACTIVE REGION WITH SELF-ALIGNED SOURCE/DRAIN CONTACT

(71) Applicant: International Business Machines Corporation, Armonk, NY (US)

(72) Inventors: Su Chen Fan, Cohoes, NY (US); Cheng Chi, Jersey City, NJ (US); Kangguo Cheng, Schenectady, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/372,716

(22) Filed: Apr. 2, 2019

(65) Prior Publication Data
US 2020/0321244 A1  Oct. 8, 2020

(51) Int. Cl.
*H01L 21/768* (2006.01)
*H01L 29/78* (2006.01)
*H01L 23/522* (2006.01)

(52) U.S. Cl.
CPC .. *H01L 21/76802* (2013.01); *H01L 21/76831* (2013.01); *H01L 21/76877* (2013.01); *H01L 23/5226* (2013.01); *H01L 29/7851* (2013.01)

(58) Field of Classification Search
None
See application file for complete search history.

(56) References Cited

U.S. PATENT DOCUMENTS

| 4,774,206 A | 9/1988 | Willer |
| 9,401,409 B2 | 7/2016 | Lee et al. |

(Continued)

FOREIGN PATENT DOCUMENTS

| CN | 105762105 A | 7/2016 |
| EP | 0237826 A2 | 9/1987 |

(Continued)

OTHER PUBLICATIONS

Kamineni et al.; "Tungsten and Cobalt Metallization: A Material Study for MOL Local Interconnects"; Interconnect Technology Conference/Advanced Metallization Conference (IITC/AMC), IEEE (2016); 3 pages.

(Continued)

*Primary Examiner* — Asok K Sarkar
(74) *Attorney, Agent, or Firm* — Cantor Colburn LLP; Joseph Petrokaitis

(57) ABSTRACT

A method for forming a semiconductor structure is provided. The method includes depositing a dielectric material in a first opening above a first source/drain region in a first region of the semiconductor structure and in a second and a third opening above a respective second and a third source/drain region in a second region of the silicon structure. There is a gate region between the second and third source/drain regions. The method etches away the dielectric material deposited in the first opening and deposits an organic material in the first opening. The method further etches a region above the gate region between the second and third source/drain regions to expose the gate region and form a fourth opening and removes the organic material from the first opening. The method deposits a metal in the first opening and the fourth opening.

15 Claims, 15 Drawing Sheets

(56) References Cited

U.S. PATENT DOCUMENTS

| | | |
|---|---|---|
| 9,722,043 B2 | 8/2017 | Basker et al. |
| 9,735,242 B2 | 8/2017 | Xie et al. |
| 9,780,178 B2 | 10/2017 | Xie et al. |
| 9,818,651 B2 | 11/2017 | Bouche et al. |
| 9,824,921 B1 | 11/2017 | Labonte et al. |
| 9,941,278 B2 | 4/2018 | Labonte et al. |
| 2016/0035846 A1 | 2/2016 | Lee et al. |
| 2016/0365424 A1 | 12/2016 | Basker et al. |
| 2018/0182668 A1 | 6/2018 | Xie et al. |
| 2020/0035555 A1* | 1/2020 | Zang .................... H01L 21/7684 |
| 2020/0083117 A1* | 3/2020 | Greene ............... H01L 27/0924 |
| 2020/0135872 A1* | 4/2020 | Zang .................... H01L 29/7851 |
| 2020/0135885 A1* | 4/2020 | Xie .................... H01L 21/76831 |
| 2020/0135927 A1* | 4/2020 | Ok .................... H01L 29/66795 |

FOREIGN PATENT DOCUMENTS

| | | | |
|---|---|---|---|
| JP | H1050858 A | 2/1998 | |
| JP | 4458442 B2 | 4/2010 | |

OTHER PUBLICATIONS

Watson et al.; "The Fabrication of Self-Aligned Ohmic Cobalt Contacts to Relaxed, N-Type Si0.7 GE0.3"; Materials Research Society, vol. 320 (1994); 6 pages.

* cited by examiner

GATE CONTACT OVER ACTIVE REGION WITH SELF-ALIGNED SOURCE/DRAIN CONTACT

BACKGROUND

The present invention generally relates to semiconductor processing and devices and more specifically, to gate contacts over action regions with self-aligned source/drain contacts.

Typical semiconductor devices are formed using active regions of a wafer. The active regions are defined by isolation regions used to separate and electrically isolate adjacent semiconductor devices. For example, in an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain. Electrical current is induced to flow through the channel region from the source to the drain by a voltage applied at the gate electrode.

IC structures have middle of the line (MOL) contacts that connect the semiconductor devices to back end of the line (BEOL) metal levels. For example, a MOSFET can have a gate contact (also referred to herein as a CB contact) and source/drain contacts (also referred to herein as a CA contacts). The gate contact can extend vertically through an interlayer dielectric (ILD) material of the IC from a metal wire or via in the first back end of the line (BEOL) metal level (referred to herein as MO) to the gate of the MOSFET. The source/drain contacts can extend vertically through the ILD material from metal wires or vias in the BEOL metal level to metal plugsMP, which are on the source/drain regions of the MOSFET. Historically, in order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, methods have been developed that allow for a gate contact to be formed on a portion of the gate directly above the active region (referred to herein as a CB-over-active or CBoA) or close thereto, but ensures that the risk of a short developing between the gate contact and any of the metal plugs is avoided (or at least significantly reduced).

SUMMARY

Embodiments of the present invention are directed to a method for forming a silicon structure. The method includes depositing a dielectric material in a first opening above a first source/drain region in a first region of the silicon structure and in a second and a third opening above a respective second and a third source/drain region in a second region of the silicon structure. There is a gate region between the second and third source/drain regions. The method etches away the dielectric material deposited in the first opening and deposits an organic material in the first opening. The method further etches a region above the gate region between the second and third source/drain regions to expose the gate region and form a fourth opening and removes the organic material from the first opening. The method deposits a metal in the first opening and the fourth opening.

Embodiments of the present invention are directed to a method for forming a silicon structure. The method includes depositing an etch stop along walls of a first opening above a first source/drain region in a first region of the silicon structure and along walls of a second and a third opening above a respective second and a third source/drain region in a second region of the silicon structure. A gate region lies between the second and third source/drain regions. The method deposits an oxide in the first opening, the second opening, and the third opening and etches away the oxide deposited in the first opening. The method further deposits an organic material in the first opening and etches a region above the gate region between the second and third source/drain regions to expose the gate region and form a fourth opening. The method removes the organic material from the first opening and deposits a metal in the first opening and the fourth opening.

Embodiments of the present invention are directed to a semiconductor structure. The structure has a fin having a gate and a source/drain region. The structure also has a gate contact over the gate and a metal plug contact over the source/drain region. The structure has a silicon nitride region lined with an etch stop layer above the metal plug contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
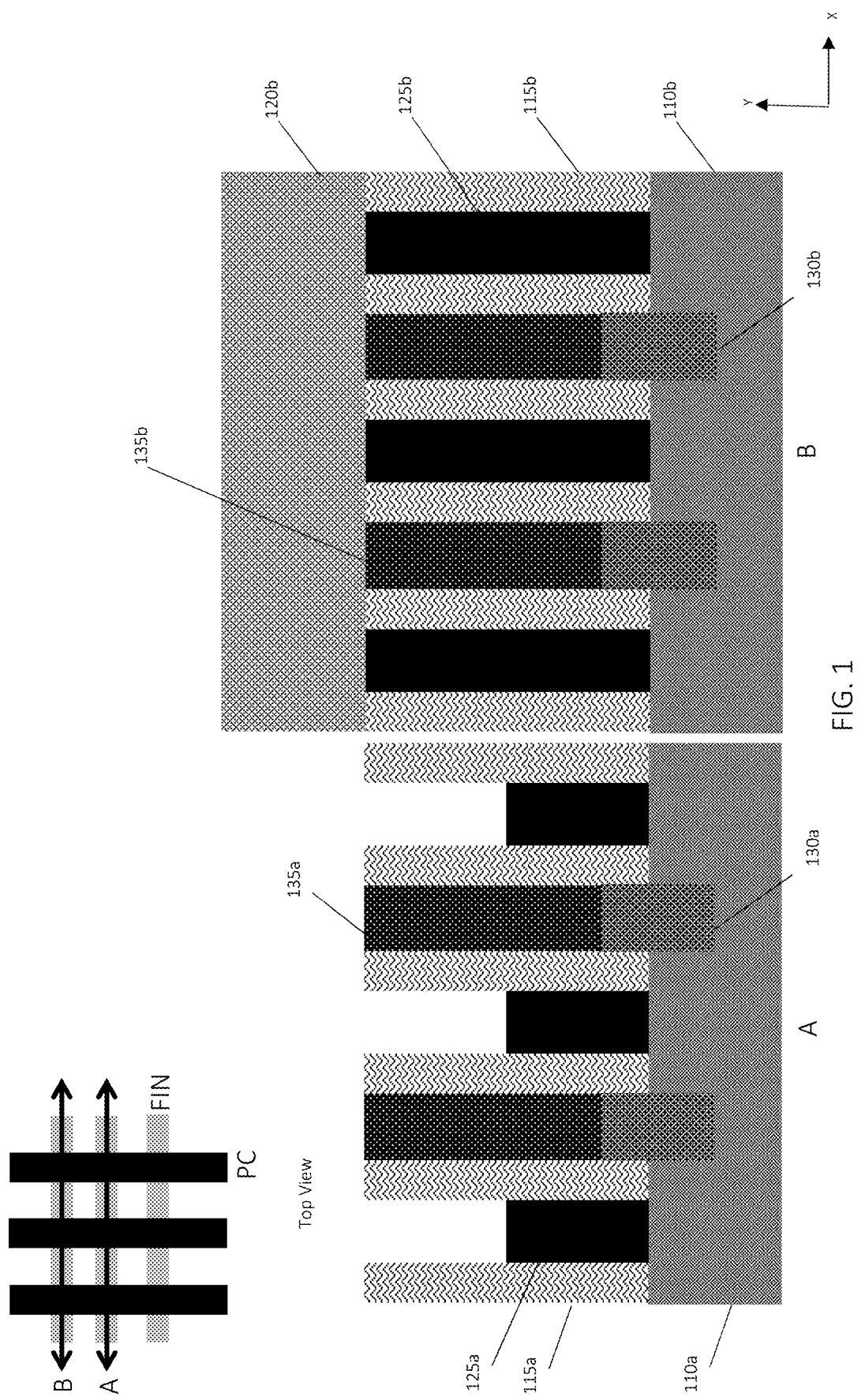
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Although this detailed description includes fabrication operations and resulting structures for specific types of nonplanar FETs, implementation of the teachings recited herein are not limited to a particular type of FET or IC architecture. Rather embodiments of the present invention are capable of being implemented in conjunction with any other type of planar or nonplanar FET or IC architecture, now known or later developed.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices are typically formed using active regions of a wafer. In an IC having a plurality of MOSFETs, each MOSFET has a source and a drain that are formed in an active region of a semiconductor layer by incorporating n-type or p-type impurities in the layer of semiconductor material. MOSFETs device geometries can be categorized as planar or nonplanar. In planar MOSFETs, the various parts of the MOSFET device are laid down as planes or layers. In nonplanar MOSFETs, the various parts of the MOSFET device are three-dimensional (3D) structures having height, length, and width dimension. Many nonplanar MOSFET architectures form one or more portions of the transistor (e.g., channel, source, drain, gate, etc.) as a fin-shaped structure. In order to decrease the center-to-center distance (or pitch) between a given feature (e.g., gate) of adjacent transistors and increase device density on the wafer, the aspect ratios of these fin-shaped structures are often high. In other words, each fin-shaped structure in a given nonplanar MOSFET is much taller than it is wide.

A fin-type FET (FinFET) is an example of a nonplanar MOSFET that has as a main feature an elongated fin-shaped element. The gate is wrapped around a central portion of the fin. The portion of the fin that is under the gate functions as the channel. The portions of the fin that are not under the gate function as the source or the drain (S/D), respectively. The thickness of the fin determines an effective channel length of the device.

Another example of a nonplanar MOSFET is a vertical FET (VFET), which, like the FinFET, employs a semiconductor fin. In VFETs, side-gates wrap around the perimeter of the fin. The side-gates can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

The placement of gate contacts ("CB") without placing the gate contact on a portion of the gate that is over the active region (referred to herein as a CB-over-active or CBoA) CBoA is very restrictive. Without CBoA, placement, gate contacts are only allowed over the shallow trench isolation ("STI") region, so there are limited options to access input pins. Design rules tend to place CBs in a row and crowded together. Furthermore, as previously noted herein, the source/drain contacts can extend vertically through the ILD material from metal wires or vias in the BEOL metal level to metal plugs (also referred to herein as MPmetal plug (MP)contacts), which are on the source/drain regions of the MOSFET. Design rules also tend to not allow the MP contacts to pass by a CB, so there are limited wiring options. With CBoA placement, the CB can be staggered easily, providing easier access, and MP is allowed to pass by CB, providing for easier wiring. Prior attempts at CBoA required the use of a dielectric cap over the metal gate.

CBoA placement is challenging, however. Given current CB sizing, there is a high problem of CB to MP shorts. Even if one were to recess the MP, there remains a high risk of failure because the CB over-etch erodes the spacer. In addition, with CA misalignment to MP there is an increased chance of CA to dummy gate short and increased CA to MP resistance which degrades device performance. Avoiding CB to MP shorts usually involves MP recess, but the deeper the MP, the higher the MP lateral resistance and there is more trouble for CA access to MP. Also, for CB RIE, there needs to be a nitride etch to open the gate with a good amount of overetch to ensure that all gates are opened. This can cause the spacer to be etched down causing CB to MP short.

Turning now to an overview of the aspects of the invention, one or more embodiments of the invention address the above-described shortcomings of the prior art by providing a self-aligned plug on top of MP that enables self-aligned CA and CB-over-active.

The above-described aspects of the invention address the shortcomings of the prior art by providing a system and method for a CB-over-active region with a self-aligned CA that includes a self-aligned plug on top of MP that enables self-aligned CA and CB over-active. The structure uses an inverse-tapered CB and a third material surrounding the CB. An etch resistive liner is placed around the third material in the CB region, but not in the CA region.

Turning now to a more detailed description of aspects of the present invention, FIG. 1 depicts a cross-sectional view of a semiconductor structure after a processing operation according to one or more embodiments of the present invention. Shown in the figure is a series of FinFETS, but the present invention could also be used in a planar device, nanosheet, VFET, or nanowire structures. The FinFETS shown can be connected in series or parallel, depending upon how a design were to structure them. The starting structure may be conventionally fabricated, for example, using known processes and techniques. Also, unless noted otherwise, conventional processes described herein may be used to achieve individual stages of the fabrication process described. The structure shown in FIG. 1 is a structure following a tungsten gate recess stage.

Illustrated are cutaways of two fins 110a and 110b, as well as the structures above the fins. A top view of the fins is illustrated along with the two cutaways along cutaways A and B. In cutaway A lies the fin 110a having three High K Metal Gates ("HKMG") 125a comprising tungsten and two source/drain regions 130a. The HKMG's 125a have been etched back by an RIE process or a wet process. Silicon nitride spacers 115a reside along the sides of the HKMG's 125a, as well as the sides of the source/drain regions 130a and ILD region 135a. Along cutaway B, lies the fin 110ab having three High K Metal Gates ("HKMG") 125b comprising tungsten and two source/drain regions 130b. The HKMG's 125b have been protected from being etched back by the RIE procedure by organic planarization layer 120b. Silicon nitride spacers 115b reside along the sides of the HKMG's 125b, as well as the sides of the source/drain regions 130b and ILD region 135b. ILD regions 135a and 135b may comprise silicon dioxide, for example.

Figure 2:
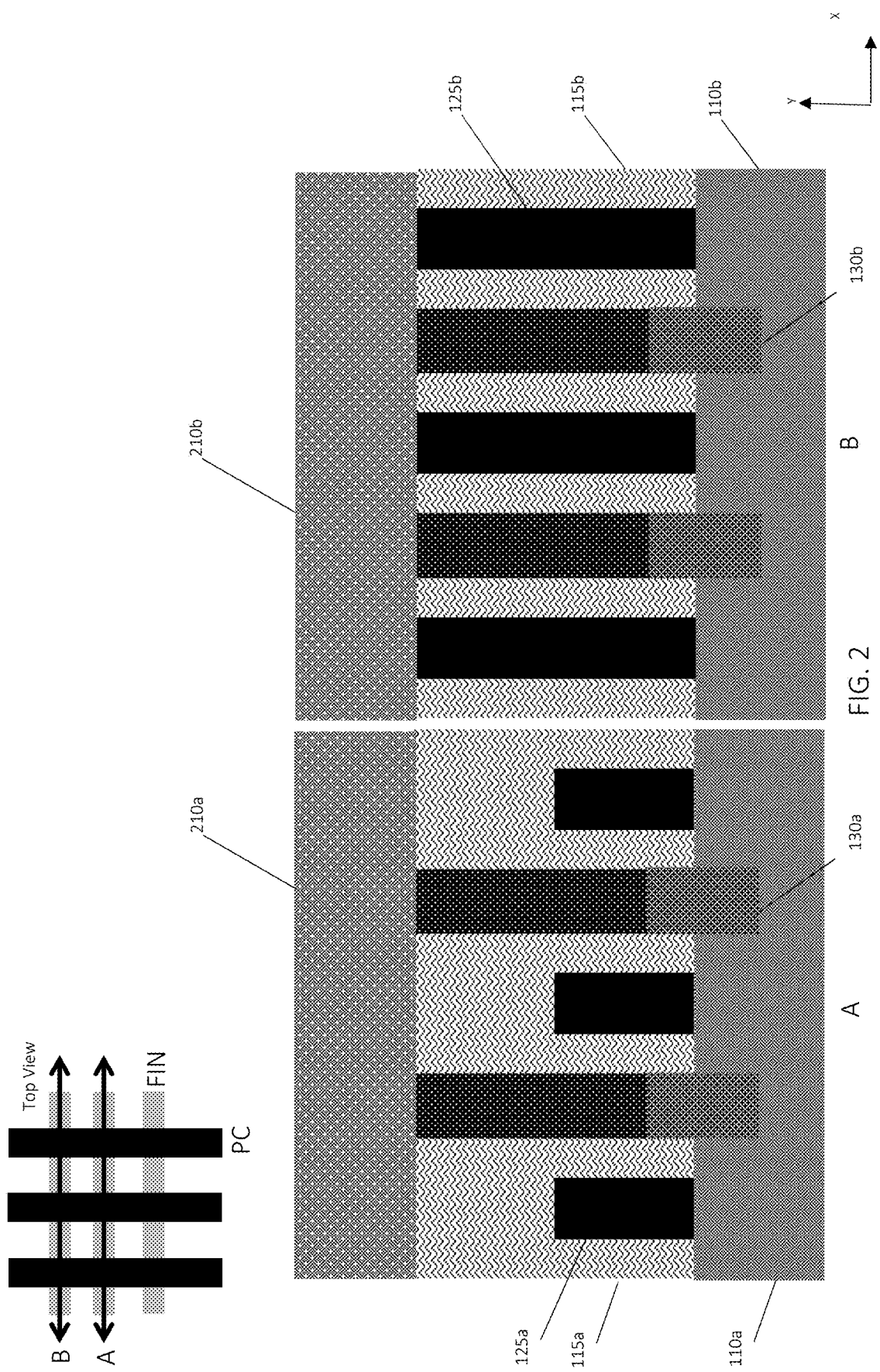
FIG. 2 depicts a cross-sectional view of a semiconductor structure after a processing operation according to one or more embodiments of the present invention.

FIG. 2 depicts a cross-sectional view of a semiconductor structure after a processing operation according to one or more embodiments of the present invention. The organic planarization layer 120b (shown previously in FIG. 1) is stripped. Silicon nitride is deposited above the HKMG's 130a and further ILD layers 210a and 210b are deposited after which follows a CMP process.

Figure 3:
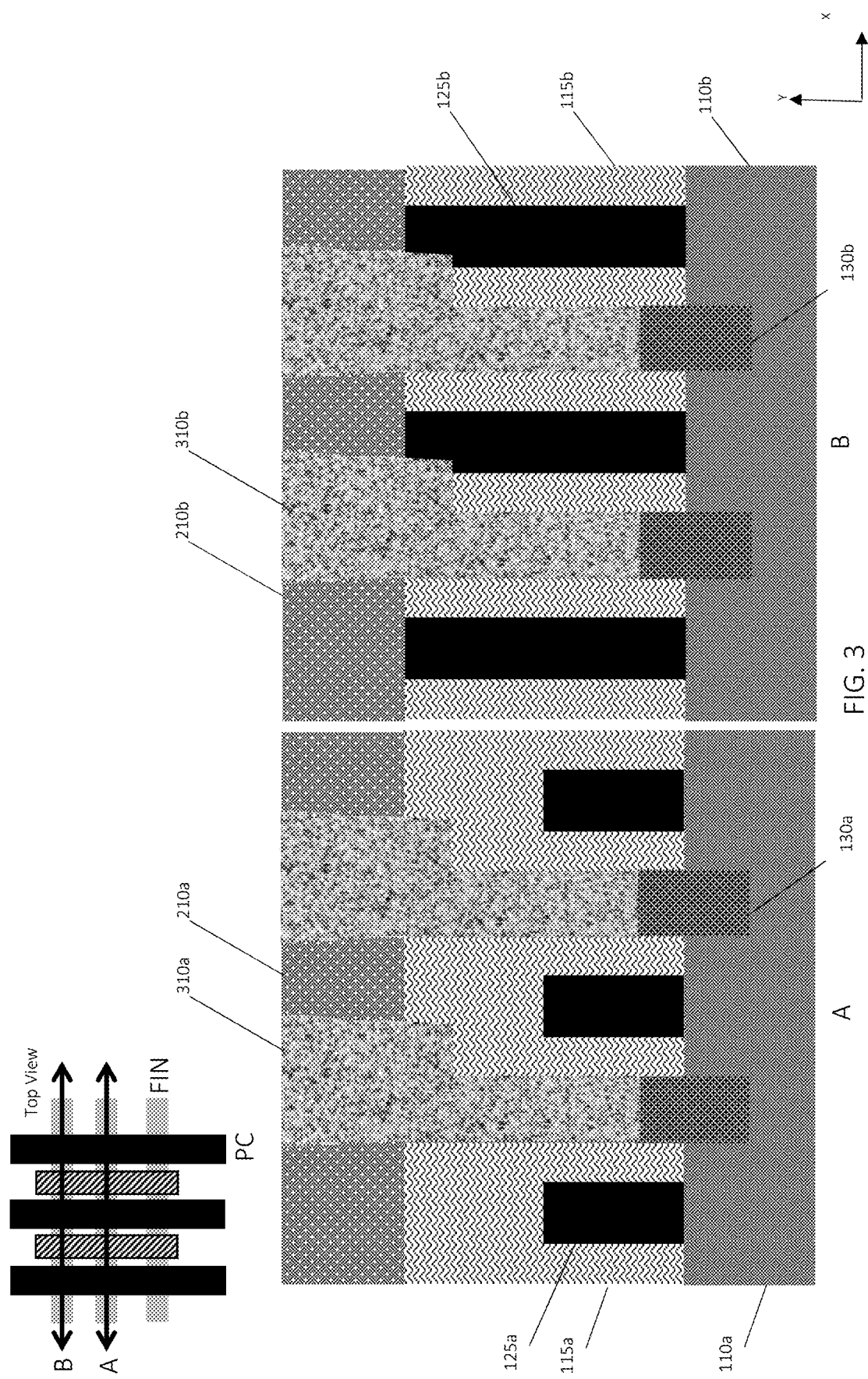
FIG. 3 depicts a cross-sectional view of a semiconductor structure after a processing operation according to one or more embodiments of the present invention.

FIG. 3 depicts a cross-sectional view of a semiconductor structure after a processing operation according to one or more embodiments of the present invention. A lithography, RIE process, fill, and CMP is performed to pattern and form metal plug contacts, MP, 310a and 310b. MP 310a and 310b can be tungsten or cobalt, for example.

Figure 4:
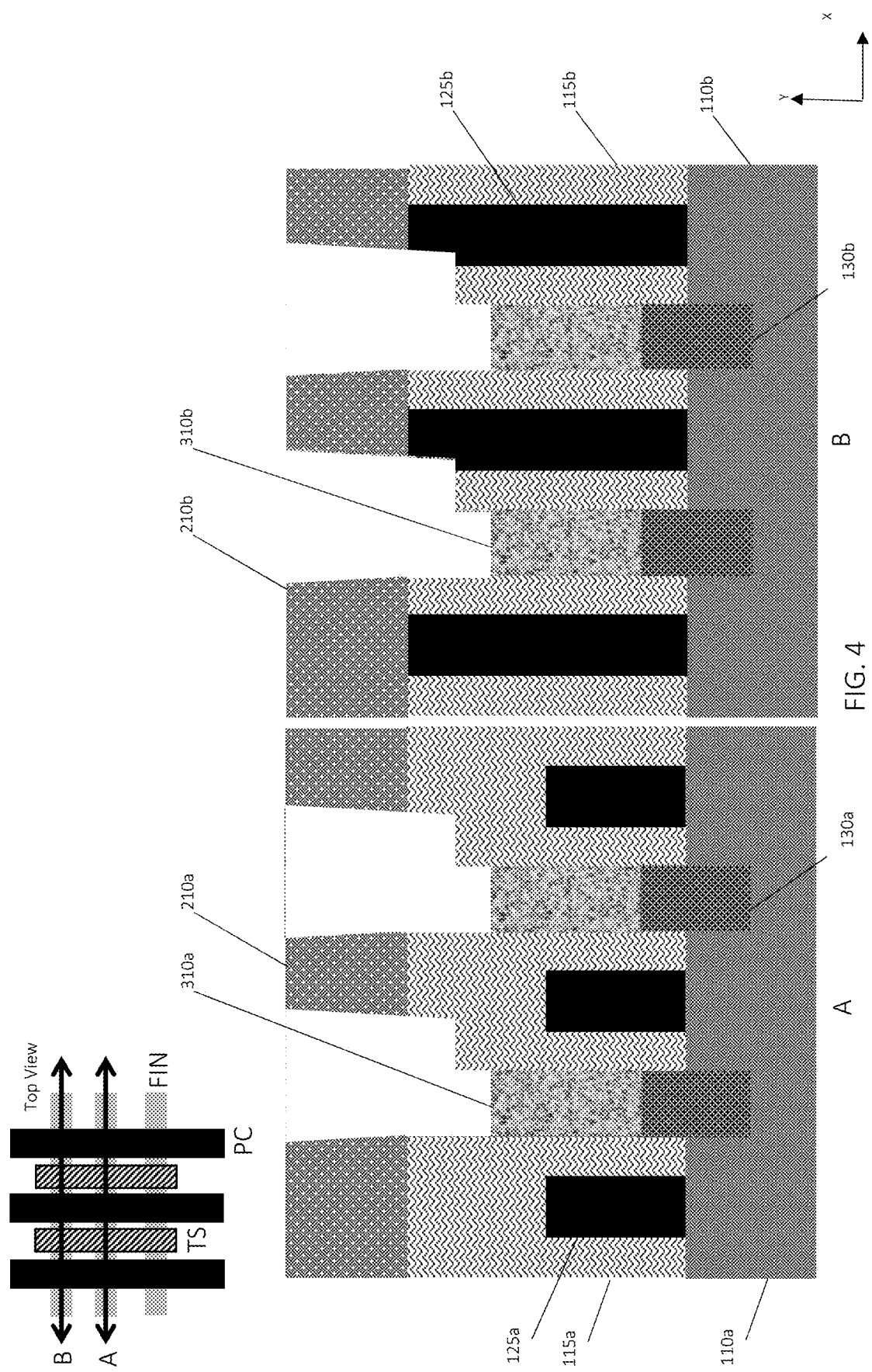
FIG. 4 depicts a cross-sectional view of a semiconductor structure after a processing operation according to one or more embodiments of the present invention.

FIG. 4 depicts a cross-sectional view of a semiconductor structure after a processing operation according to one or more embodiments of the present invention. MP 310a and 310b are recessed by a metal recess process to form openings above the metal plug contacts 310a and 310b.

Figure 5:
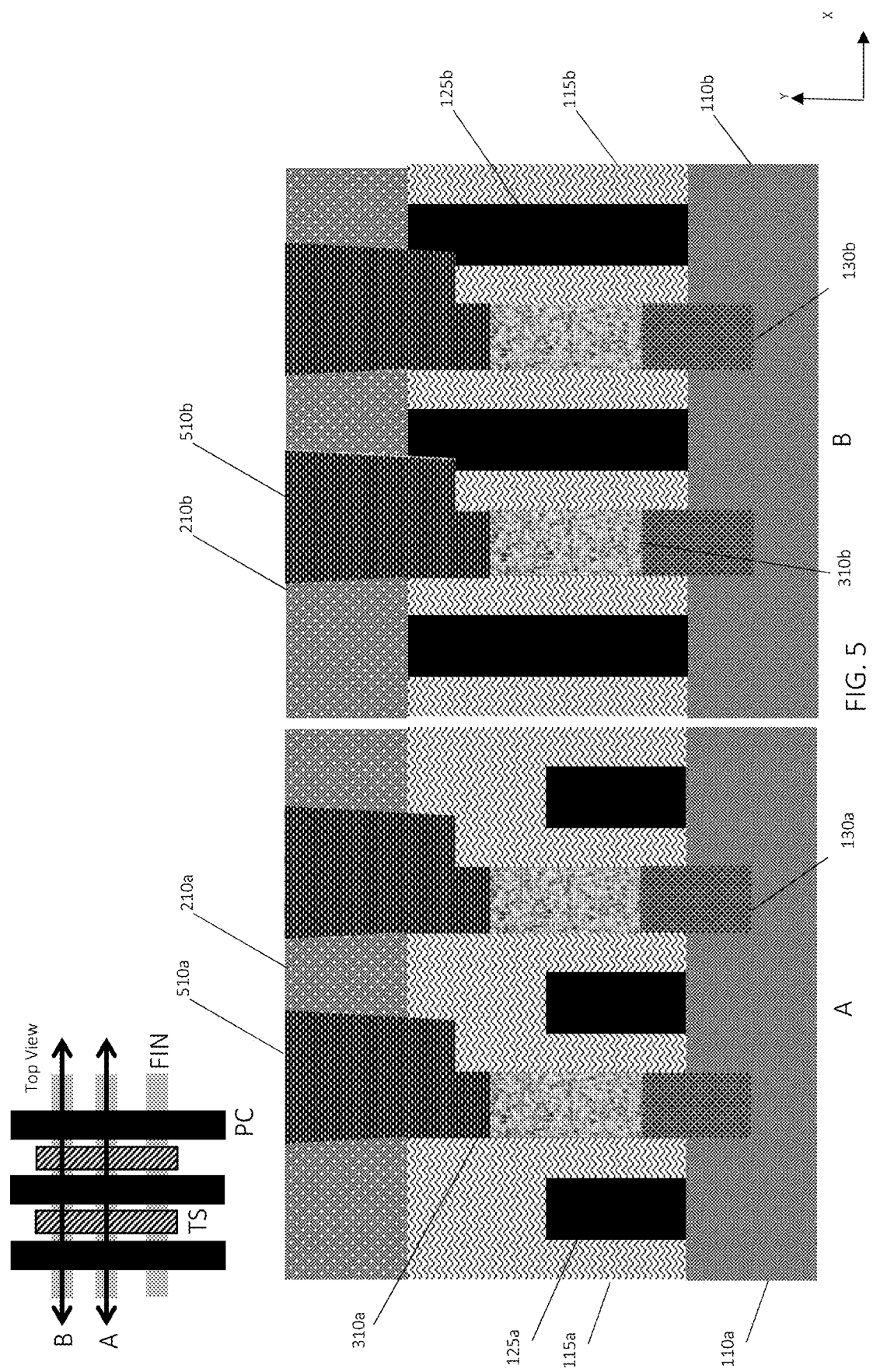
FIG. 5 depicts a cross-sectional view of a semiconductor structure after a processing operation according to one or more embodiments of the present invention.

FIGS. 5-11 illustrate a first process of forming gate contacts over action regions with self-aligned source/drain contacts. FIG. 5 depicts a cross-sectional view of a semiconductor structure after a processing operation according to one or more embodiments of the present invention. In this figure, a dielectric 510a and 510b fills the gaps previously made above the MP 310a and 310b. The dielectric can be SiCO, for example. Following fill with the dielectric, a CMP process is performed to along the upper surface of the structure.

Figure 6:
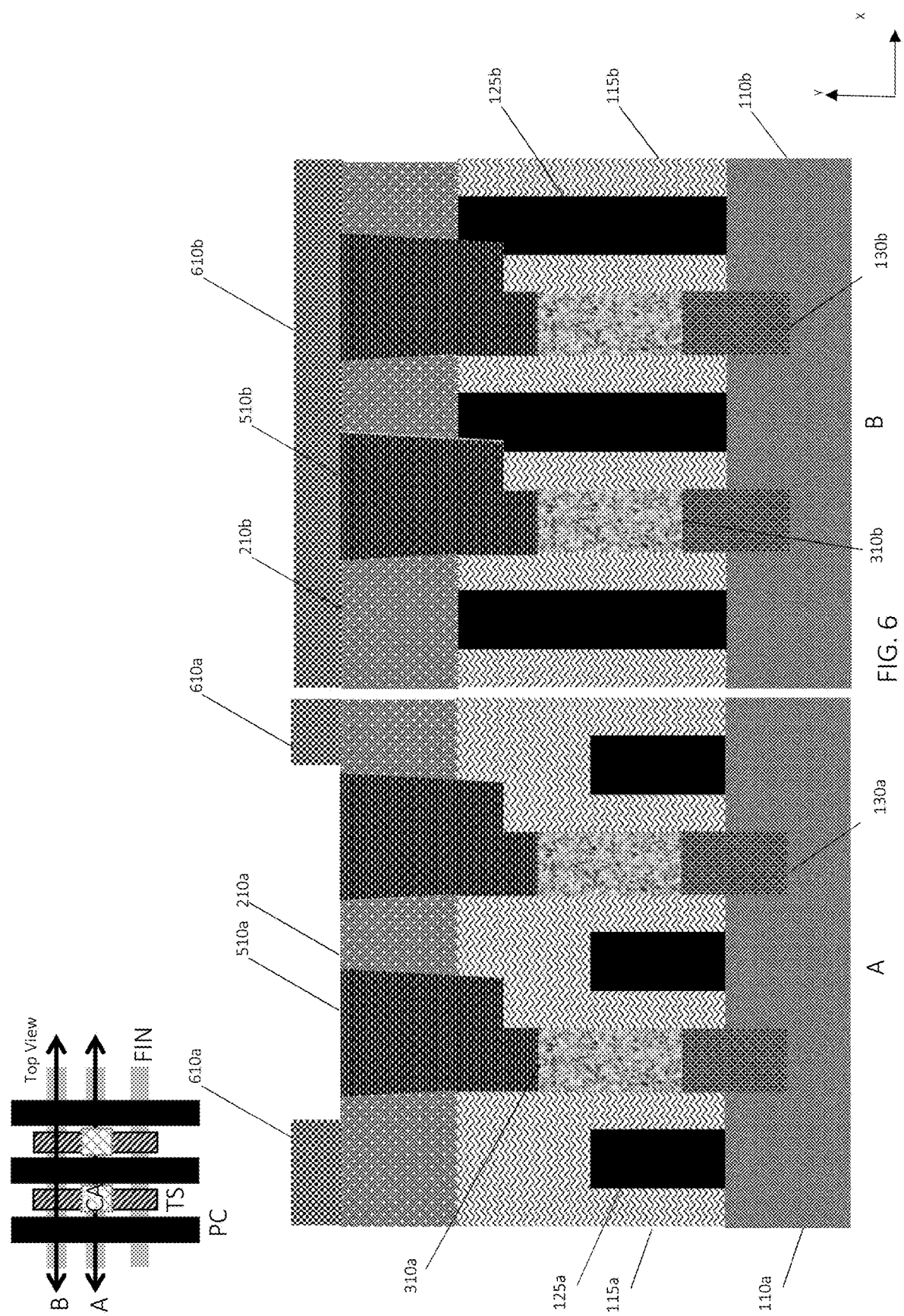
FIG. 6 depicts a cross-sectional view of a semiconductor structure after a processing operation according to one or more embodiments of the present invention.

FIG. 6 depicts a cross-sectional view of a semiconductor structure after a processing operation according to one or more embodiments of the present invention. In this stage of the process, an OPL 610a and 610b is deposited atop the structure. And the OPL 610a is patterned and lithographed to form CA openings above the dielectric 510a. The openings can be large, and the openings can even merge (as shown) into a single opening.

Figure 7:
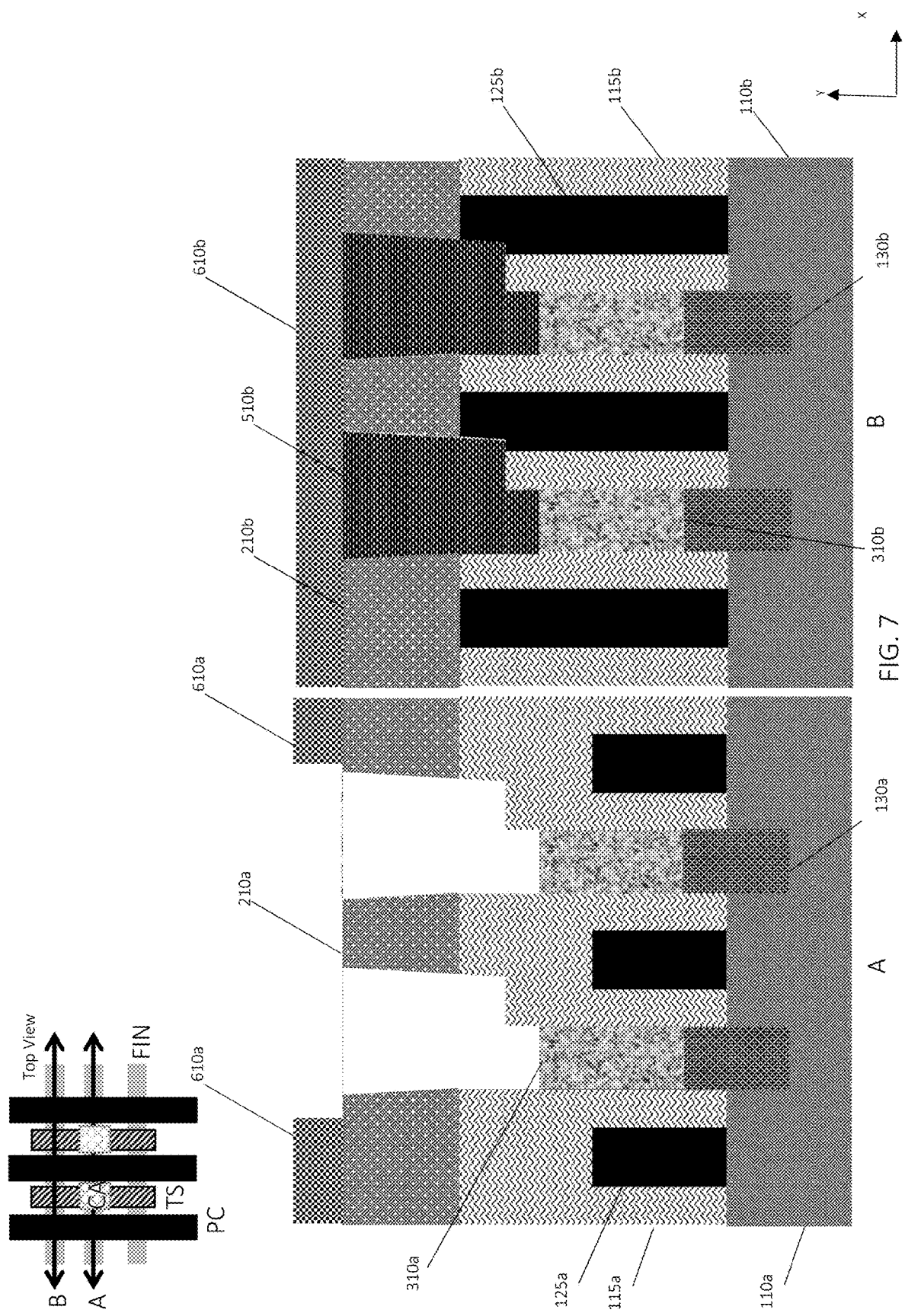
FIG. 7 depicts a cross-sectional view of a semiconductor structure after a processing operation according to one or more embodiments of the present invention.

FIG. 7 depicts a cross-sectional view of a semiconductor structure after a processing operation according to one or more embodiments of the present invention. RIE is performed to remove the dielectric 510a material, for example, SiCO, to form an opening for the CA above the MP 310a.

Figure 8:
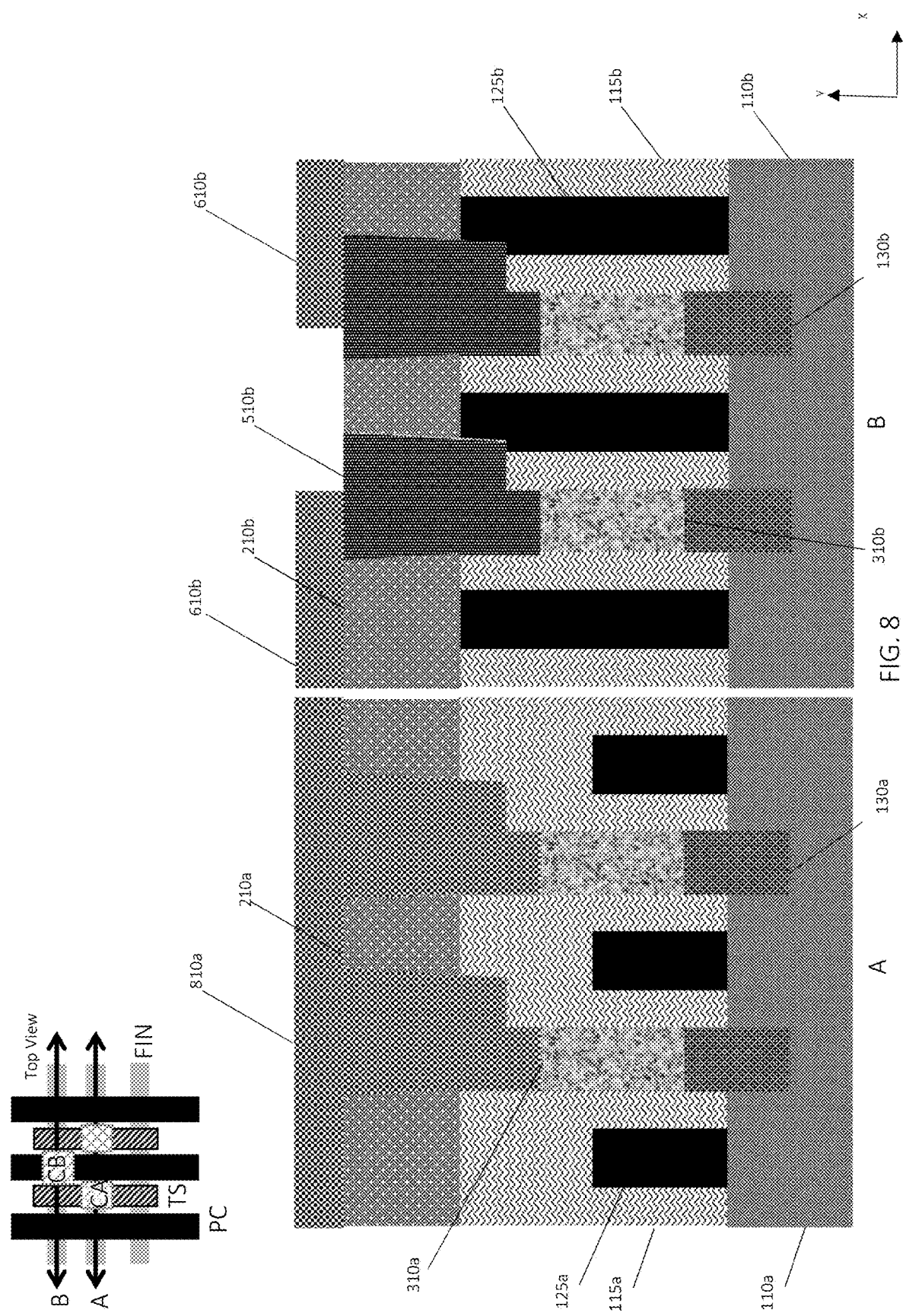
FIG. 8 depicts a cross-sectional view of a semiconductor structure after a processing operation according to one or more embodiments of the present invention.

FIG. 8 depicts a cross-sectional view of a semiconductor structure after a processing operation according to one or more embodiments of the present invention. Additional organic material 810*a* is deposited in the openings formed for the CA above and lithography is performed to define the CB area within OPL 610*b*.

Figure 9:
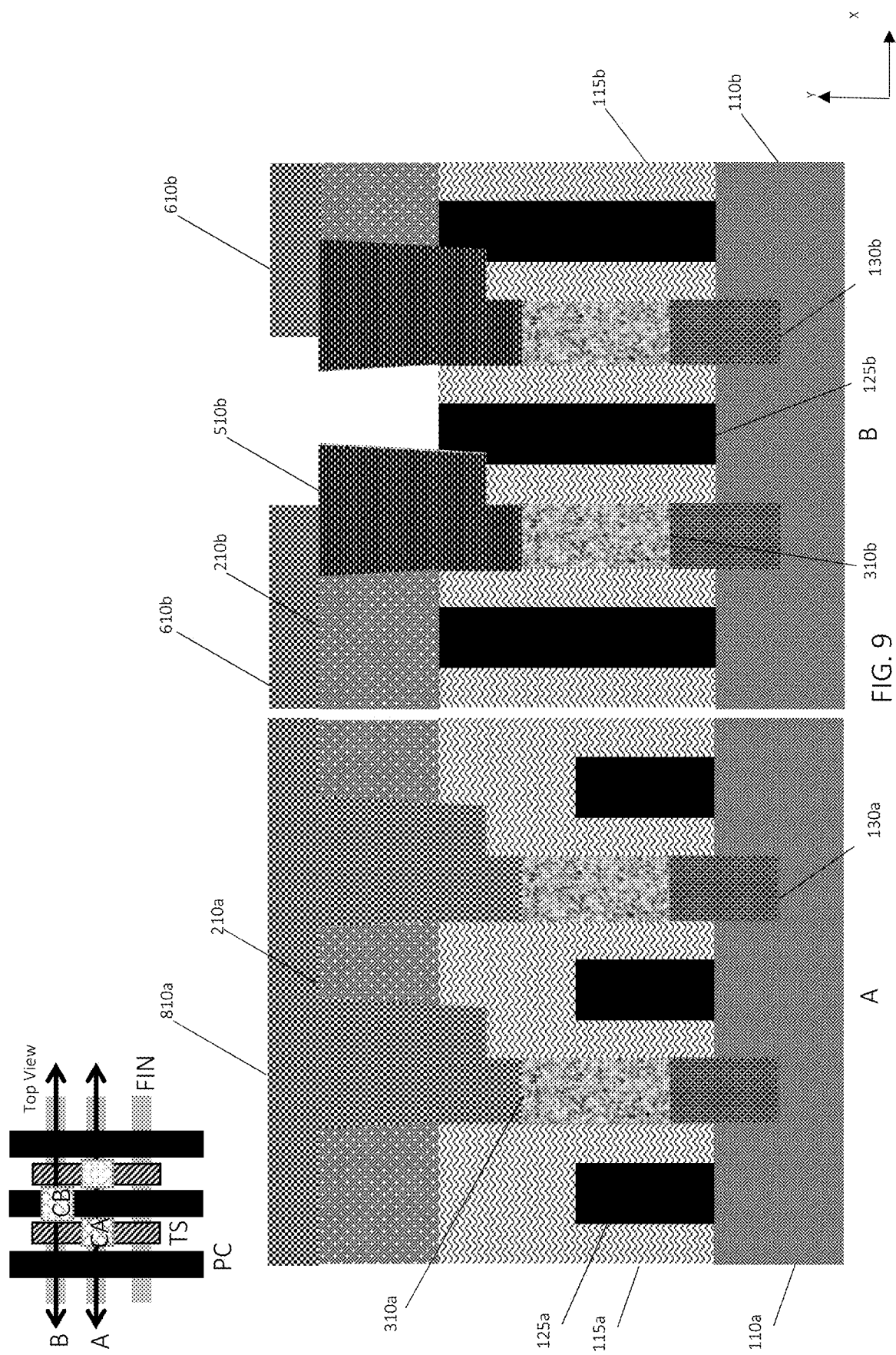
FIG. 9 depicts a cross-sectional view of a semiconductor structure after a processing operation according to one or more embodiments of the present invention.

FIG. 9 depicts a cross-sectional view of a semiconductor structure after a processing operation according to one or more embodiments of the present invention. An etch selective to the dielectric material, for example, SiCO, and silicon nitride is performed to remove the material between the dielectric regions 510*b* to form an opening for the CB above the HKMG 125*b*.

Figure 10:
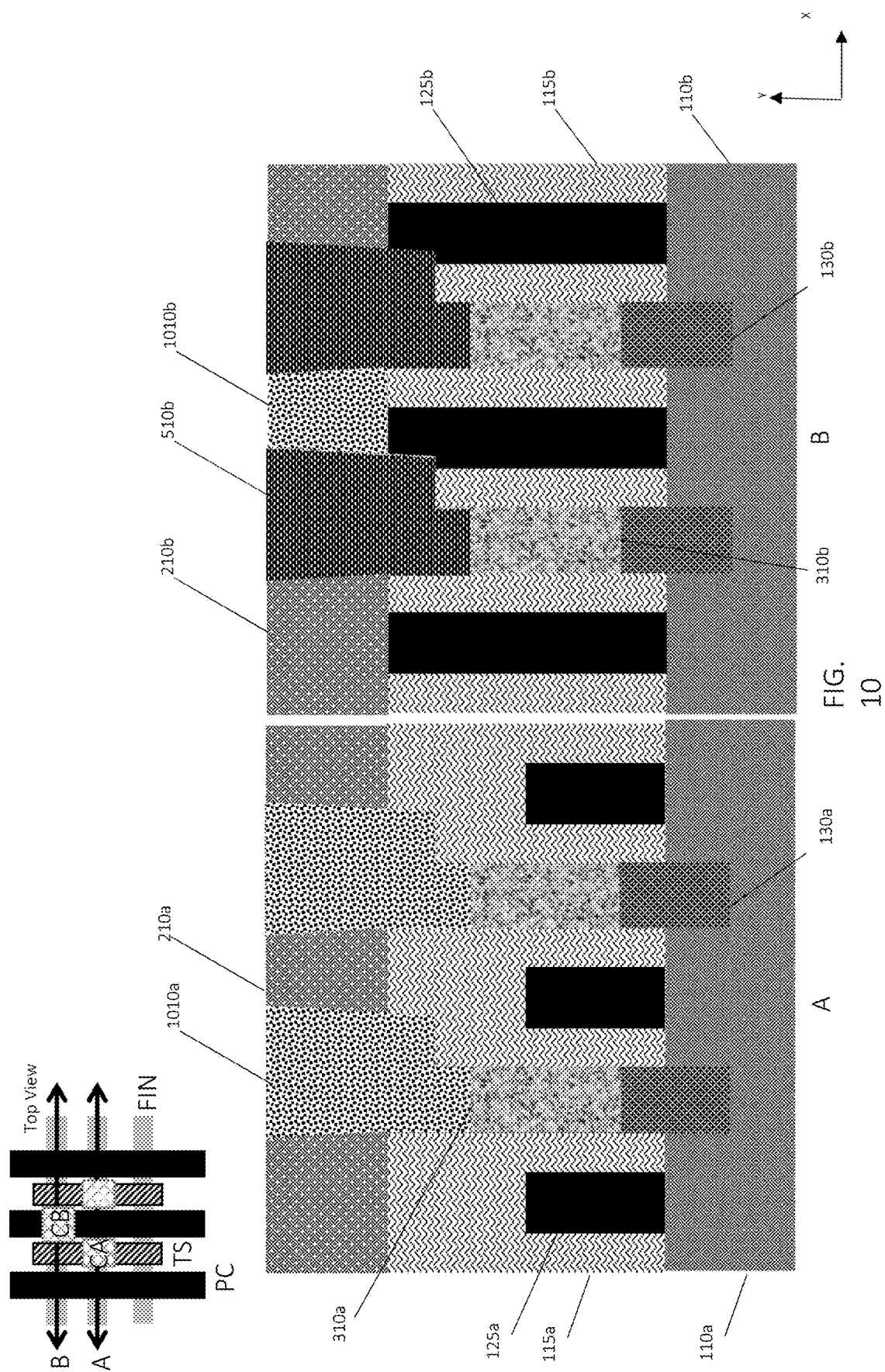
FIG. 10 depicts a cross-sectional view of a semiconductor structure after a processing operation according to one or more embodiments of the present invention.

FIG. 10 depicts a cross-sectional view of a semiconductor structure after a processing operation according to one or more embodiments of the present invention. OPL layers 810*a* and 610*b* (previously shown in FIG. 9) are stripped. A liner metal layer (not shown) of, for example, titanium, and a barrier layer (not shown) of, for example, titanium nitride can be deposited within the openings formed for the CA and CB. CA 1010*a* and CB 1010*b* are created by filling the previously created openings with, for example, tungsten or cobalt.

Figure 11:
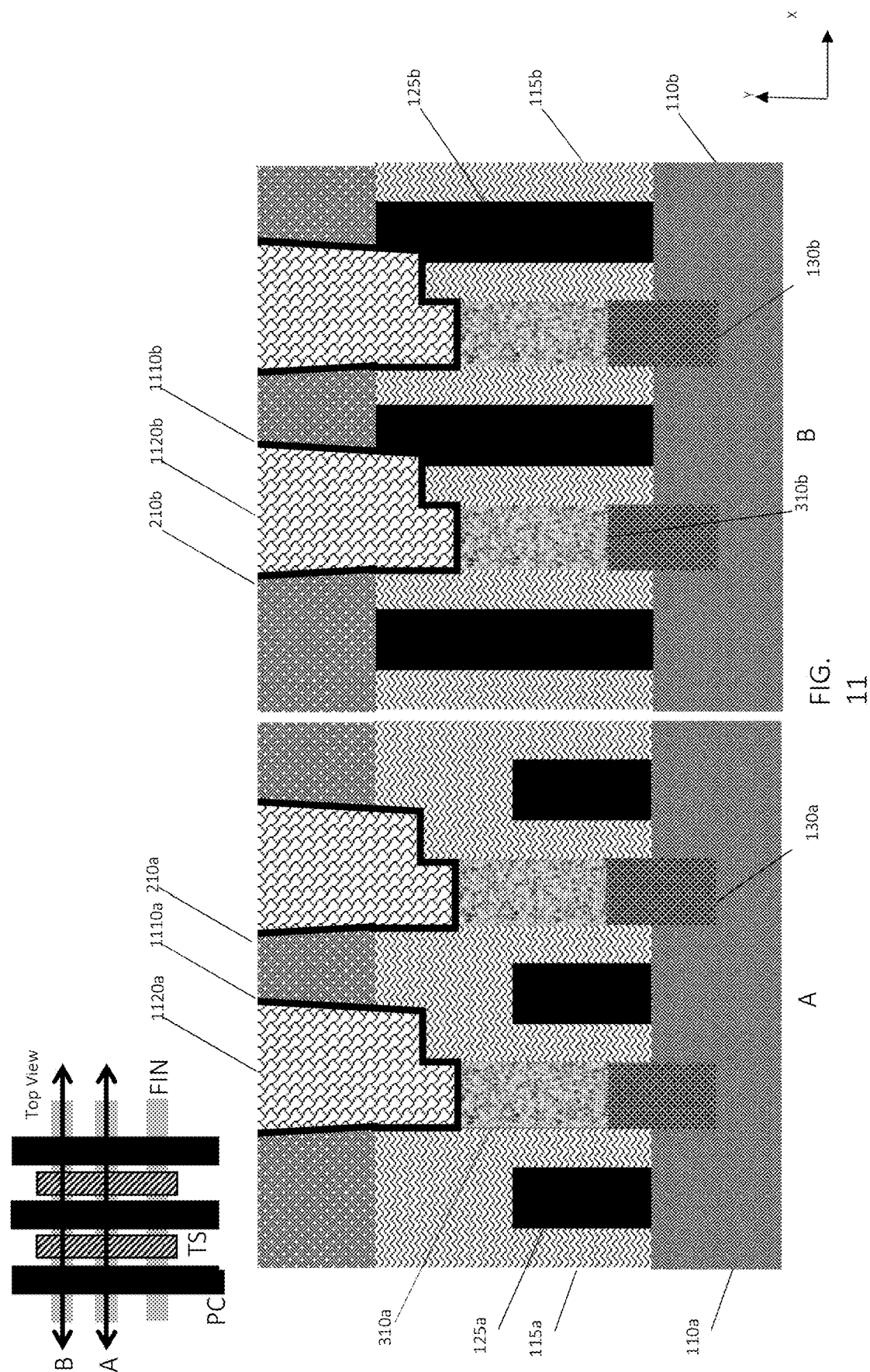
FIG. 11 depicts a cross-sectional view of a semiconductor structure after a processing operation according to one or more embodiments of the present invention.

FIGS. 11-15 illustrate a second process of forming gate contacts over action regions with self-aligned source/drain contacts. The process in FIG. 11 occurs after the process from FIG. 4. FIG. 11 depicts a cross-sectional view of a semiconductor structure after a processing operation according to one or more embodiments of the present invention. The openings above the MP 310*a* and 310*b* are lined with a liner 1110*a* and 1110*b* through ALD deposition of an oxide, such as hafnium oxide or aluminum oxide. Following lining, silicon nitride 1120*a* and 1120*b* is deposited in the openings.

Figure 12:
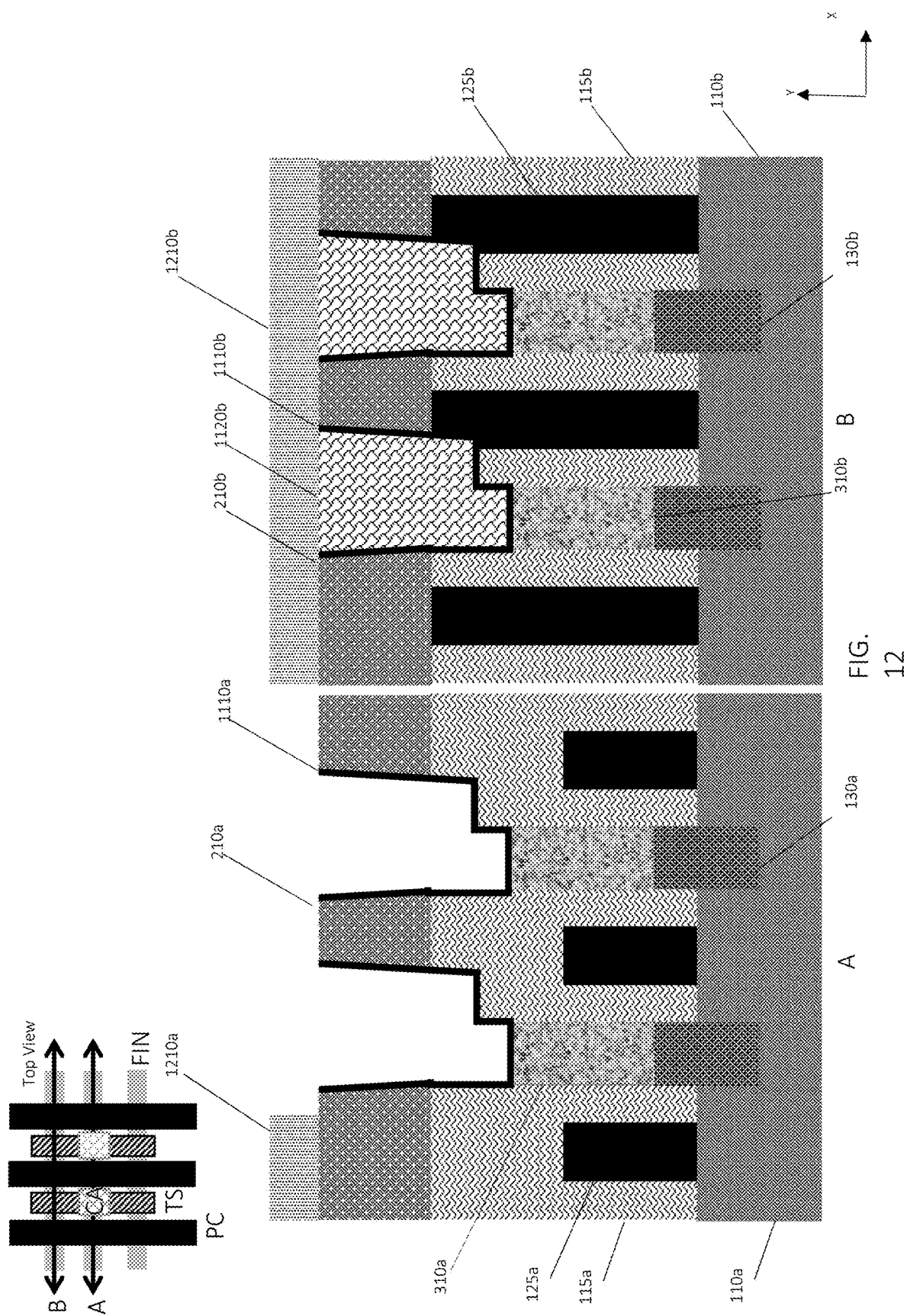
FIG. 12 depicts a cross-sectional view of a semiconductor structure after a processing operation according to one or more embodiments of the present invention.

FIG. 12 depicts a cross-sectional view of a semiconductor structure after a processing operation according to one or more embodiments of the present invention. Self-aligned CA patterning is performed depositing an OPL 1210*a* and 1210*b*. An opening above the silicon nitride 1120*a* is created through patterning and lithography. The silicon nitride 1120*a* is etched away, leaving the liner 1110*a*.

Figure 13:
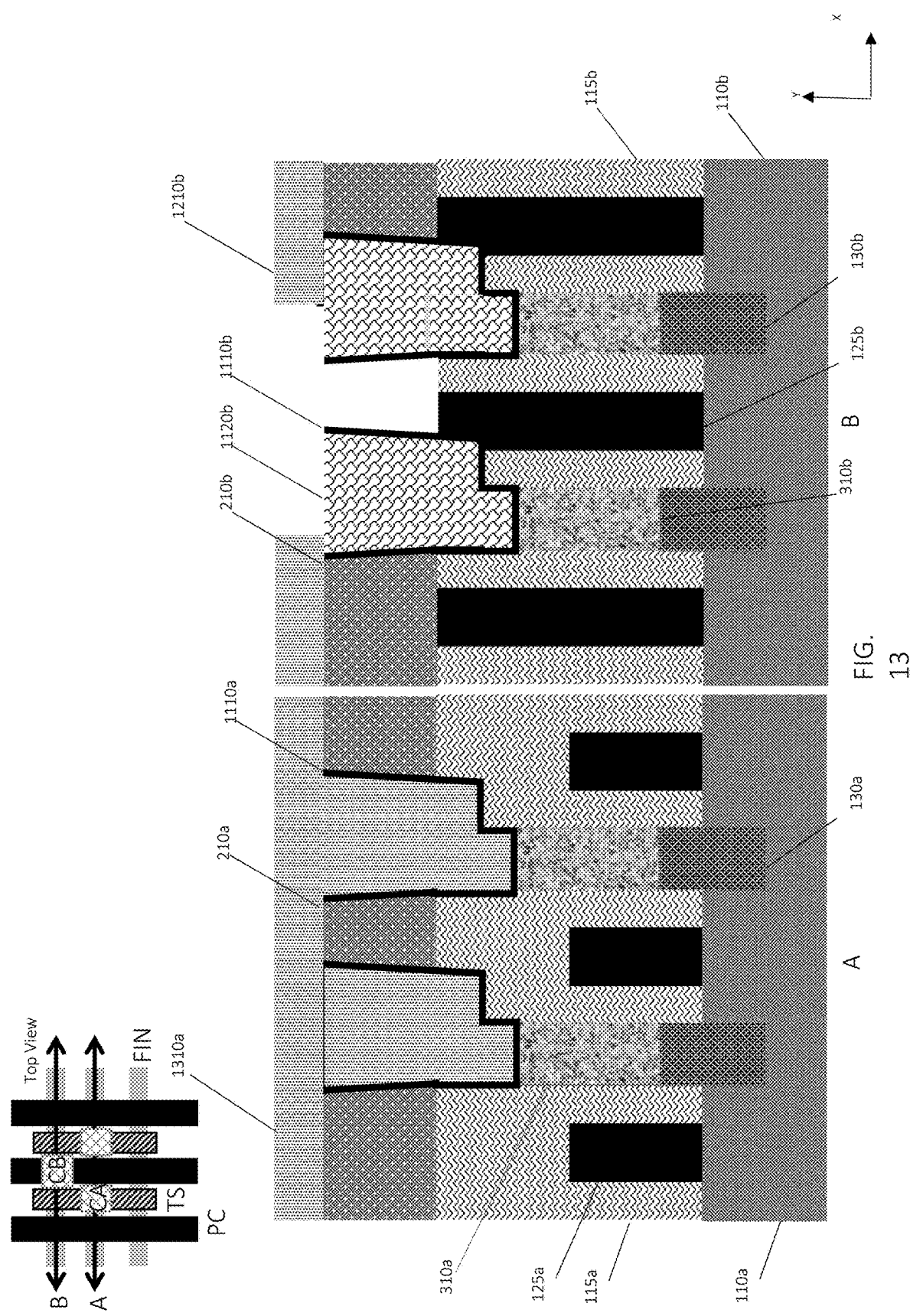
FIG. 13 depicts a cross-sectional view of a semiconductor structure after a processing operation according to one or more embodiments of the present invention.

FIG. 13 depicts a cross-sectional view of a semiconductor structure after a processing operation according to one or more embodiments of the present invention. An OPL 1310*a* is deposited in the opening created by etching away the silicon nitride 1120*a* (previously shown) and self-aligned CB patterning is performed. Lithography is used to define the CB area above the HKMG 125*b* and the silicon nitride 1120*b*. RIE selective to silicon nitride and the material comprising the liner 1110*b* is performed to form an opening above the HKMG 125*b*.

Figure 14:
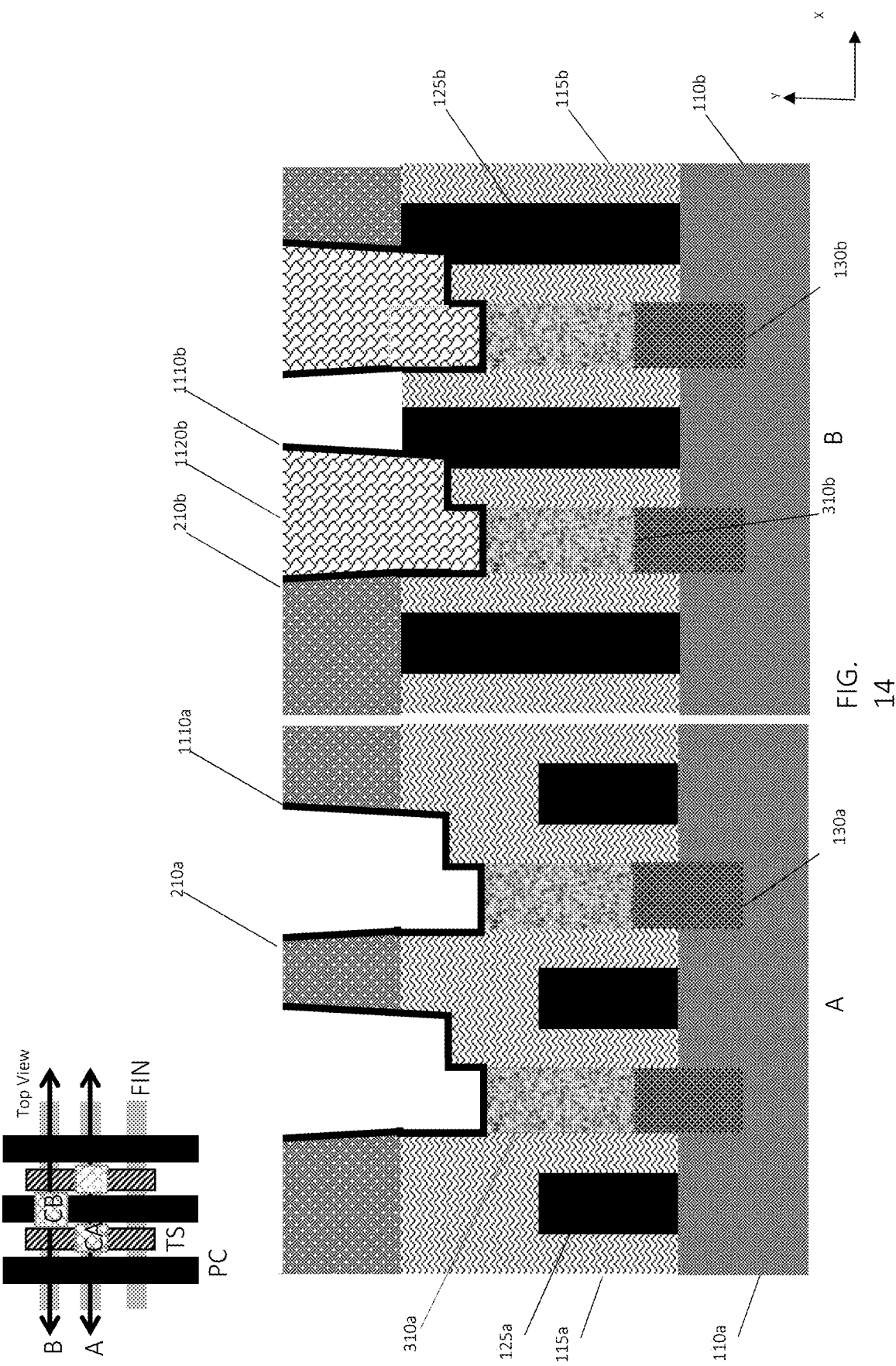
FIG. 14 depicts a cross-sectional view of a semiconductor structure after a processing operation according to one or more embodiments of the present invention.

FIG. 14 depicts a cross-sectional view of a semiconductor structure after a processing operation according to one or more embodiments of the present invention. OPL 1310*a* (previously shown) and 1210*b* (previously shown) is stripped from the top of the structure.

Figure 15:
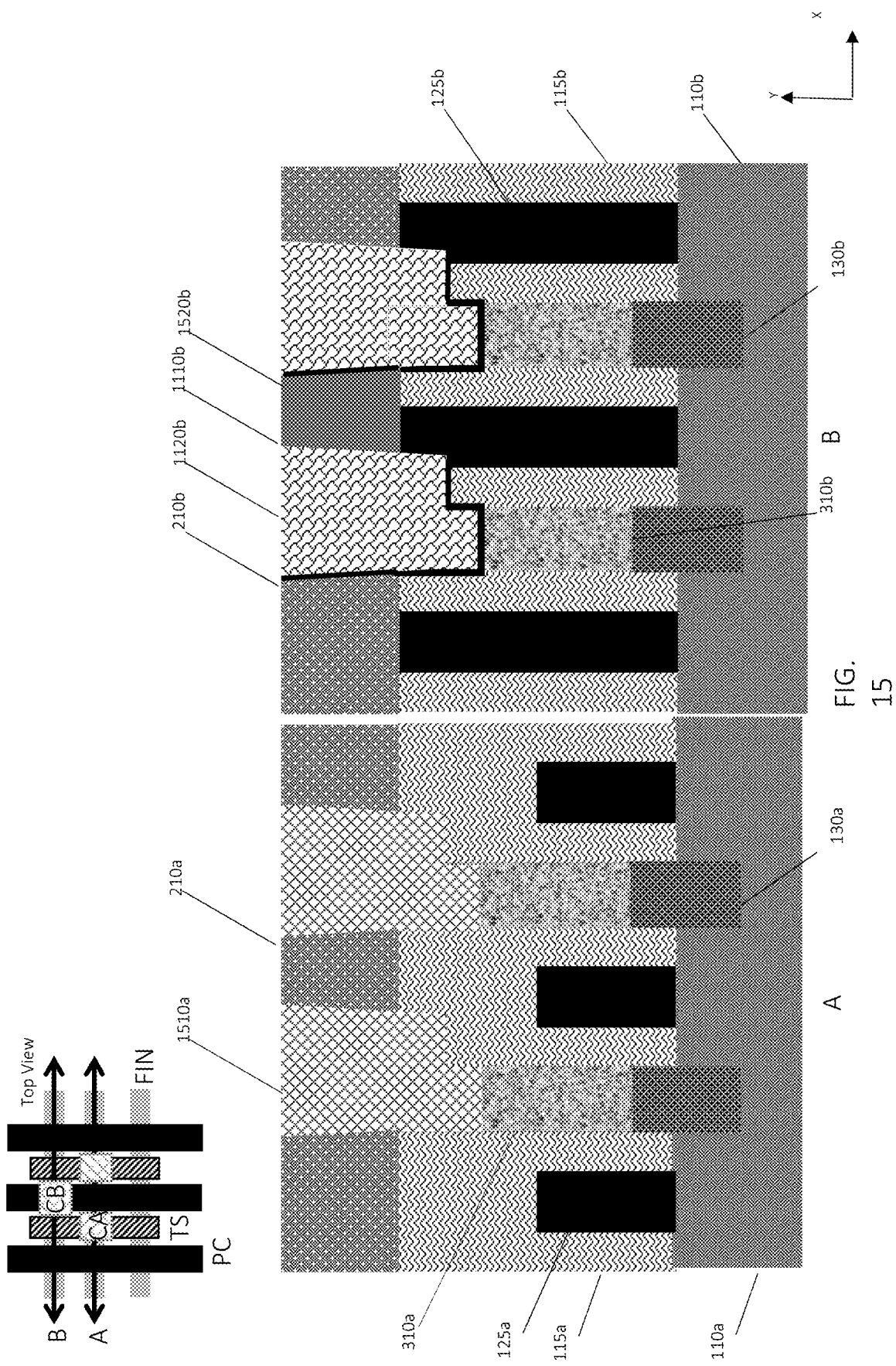
FIG. 15 depicts a cross-sectional view of a semiconductor structure after a processing operation according to one or more embodiments of the present invention.

FIG. 15 depicts a cross-sectional view of a semiconductor structure after a processing operation according to one or more embodiments of the present invention. The exposed portions of the liner 1110*a* and 1110*b* is removed through a high temperature RIE process. A liner metal layer (not shown) of, for example, titanium, and a barrier layer (not shown) of, for example, titanium nitride can be deposited within the openings formed for the CA and CB. CA 1510*a* and CB 1520*b* are created by filling the previously created openings with, for example, tungsten or cobalt.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, ALD among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor structure, the method comprising:
   depositing a dielectric material in a first opening above a first source/drain region in a first region of the semiconductor structure and in a second and a third opening above a respective second and a third source/drain region, a gate region between the second and third source/drain regions, in a second region of the semiconductor structure;
   etching away the dielectric material deposited in the first opening;
   depositing an organic material in the first opening;
   etching a region above the gate region between the second and third source/drain regions to expose the gate region and form a fourth opening;
   removing the organic material from the first opening; and
   depositing a metal in the first opening and the fourth opening.

2. The method of claim 1 further comprising, prior to etching away the dielectric material deposited in the first opening, depositing an organic planarization layer above the first region and the second region.

3. The method of claim 2 further comprising forming an opening in the organic planarization layer above the first source/drain region after depositing the organic planarization layer above the first region and the second region.

4. The method of claim 2 further comprising, prior to etching the region above the gate region between the second and third source/drain regions to expose the gate region and form the fourth opening, removing a portion of the organic planarization layer above gate region.

5. The method of claim 2 further comprising, prior to depositing a metal in the first opening and the fourth opening, removing the organic planarization layer.

6. The method of claim 1 further comprising, prior to depositing a metal in the first opening and the fourth opening, depositing a liner metal layer in the first opening and the fourth opening.

7. The method of claim 6 further comprising depositing a barrier layer in the first opening and the fourth opening.

8. A method for forming a semiconductor structure, the method comprising:
   depositing an etch stop along walls of a first opening above a first source/drain region in a first region of the semiconductor structure and along walls of a second and a third opening above a respective second and a third source/drain region, a gate region between the second and third source/drain regions, in a second region of the semiconductor structure;
   depositing an oxide in the first opening, the second opening, and the third opening;
   etching away the oxide deposited in the first opening;
   depositing an organic material in the first opening;
   etching a region above the gate region between the second and third source/drain regions to expose the gate region and form a fourth opening;
   removing the organic material from the first opening; and
   depositing a metal in the first opening and the fourth opening.

9. The method of claim 8 further comprising, prior to etching away the dielectric material deposited in the first opening, depositing an organic planarization layer above the first region and the second region.

10. The method of claim 9 further comprising forming an opening in the organic planarization layer above the first source/drain region after depositing the organic planarization layer above the first region and the second region.

11. The method of claim 9 further comprising, prior to etching the region above the gate region between the second and third source/drain regions to expose the gate region and form the fourth opening, removing a portion of the organic planarization layer above gate region.

12. The method of claim 9 further comprising, prior to depositing a metal in the first opening and the fourth opening, removing the organic planarization layer.

13. The method of claim 8 further comprising removing the liner from the first opening prior to depositing the metal in the first opening.

14. The method of claim 8, wherein the etch stop comprises hafnium oxide.

15. The method of claim 8, wherein the etch stop comprises aluminum oxide.

* * * * *